(12) United States Patent
Kim et al.

(10) Patent No.: US 8,492,954 B2
(45) Date of Patent: Jul. 23, 2013

(54) ULTRASONIC SENSOR

(75) Inventors: Boum Seock Kim, Gyunggi-do (KR); Eun Tae Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 12 days.

(21) Appl. No.: 13/326,073

(22) Filed: Dec. 14, 2011

(65) Prior Publication Data
US 2013/0049537 A1 Feb. 28, 2013

(30) Foreign Application Priority Data
Aug. 29, 2011 (KR) .................. 10-2011-0086504

(51) Int. Cl.
*H01L 41/08* (2006.01)
(52) U.S. Cl.
USPC .......................................... 310/327; 310/334
(58) Field of Classification Search
USPC .................. 310/326, 327, 334–336
See application file for complete search history.

(56) References Cited

U.S. PATENT DOCUMENTS

| 5,457,352 A * | 10/1995 | Muller et al. ............... 310/327 |
| 6,396,198 B1 * | 5/2002 | Okimura et al. ........... 310/334 |
| 8,288,920 B2 * | 10/2012 | Mueller et al. ............. 310/326 |
| 2013/0038174 A1 * | 2/2013 | Kim et al. .................. 310/327 |

* cited by examiner

*Primary Examiner* — Mark Budd
(74) *Attorney, Agent, or Firm* — Ladas & Parry LLP

(57) ABSTRACT

Disclosed herein is an ultrasonic sensor including: an epoxy molding part: a piezoelectric ceramic stacked on an upper portion of the epoxy molding part; a sound absorbing material contacting sides of the piezoelectric ceramic and spaced apart from an upper portion of the piezoelectric ceramic to thereby enclose the piezoelectric ceramic and absorbing vibration; a case spaced apart from sides and a lower surface of the sound absorbing material to thereby enclose the sound absorbing material and having a shape in which a bottom surface including the epoxy molding part stacked thereon protrudes upwardly; and a molding material filled on an upper surface of the sound absorbing material and between the sides and the lower surface of the sound absorbing material and the case.

9 Claims, 1 Drawing Sheet

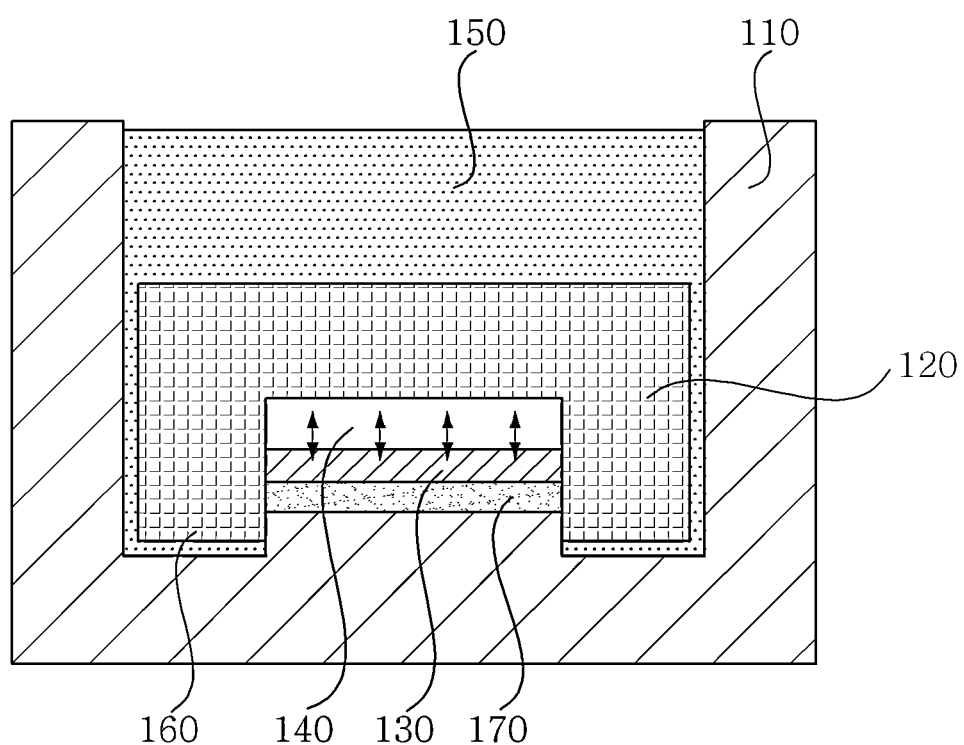

ULTRASONIC SENSOR

CROSS REFERENCE TO RELATED APPLICATION

This application claims the benefit of Korean Patent Application No. 10-2011-0086504, filed on Aug. 29, 2011, entitled "Ultrasonic Sensor", which is hereby incorporated by reference in its entirety into this application.

BACKGROUND OF THE INVENTION

1. Technical Field

The present invention relates to an ultrasonic sensor.

2. Description of the Related Art

The present invention relates to an ultrasonic sensor for sensing a rear area of a vehicle, and more particularly, to an ultrasonic sensor used in a rear stabilization device for a vehicle sensing an obstacle at the time of backing of the vehicle to thereby prevent an accident beforehand.

An ultrasonic sensor generally generates an ultrasonic wave by converting electric energy into mechanical vibration. This ultrasonic sensor has been used in home products such as an ultrasonic humidifier, an ultrasonic stimulator, an ultrasonic skin massager, industrial fields such as an ultrasonic cleaner, an ultrasonic welding machine, an ultrasonic sensor for precision measurement, or the like, a sound detector in a submarine for military purposes, a fish-finder for fishing purposes, and an ultrasonic diagnostic apparatus, an ultrasonic hydro-therapy apparatus, or the like, for medical purposes.

Particularly, the ultrasonic sensor radiates an ultrasonic wave having a predetermined frequency to a target material such as air, water, or the like, receives a signal returned by reflection, and then analyzes the received signal. Therefore, the ultrasonic sensor is used for distance measurement, terrain exploration, hydrographic survey, or the like and may be usefully used particularly under water in which the use of an electric wave or a light wave is significantly limited.

This ultrasonic sensor is configured to include an ultrasonic transducer configured of a piezoelectric element generating an ultrasonic wave having a predetermined frequency, an acoustic matching layer for increasing transfer efficiency of the ultrasonic wave, and a rear surface matching layer for controlling the entire vibration; and a case receiving the ultrasonic transducer in an inner space thereof, wherein an empty space between an inner surface of the case and the ultrasonic transducer is filled with a predetermined molding material, such that the case and the ultrasonic transducer are integrated with each other, thereby having waterproof and impact resistance characteristics.

Meanwhile, the piezoelectric element may have a disk shape or a ring shape. However, it is advantageous that the piezoelectric element has a ring shape in order to allow a molding material having a predetermined viscosity to be completely filled without a portion at which the molding material is incompletely filled during a molding process of the molding material.

Meanwhile, in the ultrasonic sensor according to the prior art as described above, the inner surface of the case is flat, such that the ultrasonic transducer configured of the piezoelectric element, the acoustic matching layer, and the rear surface matching layer is unstably coupled and fixed to the inner surface of the case in a state in which it is received in the case through the molding material.

Particularly, when there is non-uniformity in a transfer path of an ultrasonic wave from the piezoelectric element to an ultrasonic wave radiation surface through the acoustic matching layer, a molding layer, and the case, characteristics of the ultrasonic sensor may be significantly deteriorated. Therefore, careful attention needs to be paid to a manufacturing process.

The ultrasonic sensor according to the prior art having the above-mentioned characteristics had many problems. For example, a sound absorbing material serving as a sound absorbing material and a piezoelectric substance are embedded in an inner portion of the case and the sound absorbing material is attached to an upper portion of the piezoelectric substance, such that when the piezoelectric substance vibrates, the vibration is blocked by the sound absorbing material, thereby deteriorating characteristics of the ultrasonic sensor.

Therefore, research into a structure for solving the problem of the ultrasonic sensor according to the prior art as described above has been urgently demanded.

SUMMARY OF THE INVENTION

The present invention has been made in an effort to provide an ultrasonic sensor capable of minimizing residual vibration of a case.

According to a preferred embodiment of the present invention, there is provided an ultrasonic sensor including: an epoxy molding part: a piezoelectric ceramic stacked on an upper portion of the epoxy molding part; a sound absorbing material contacting sides of the piezoelectric ceramic and spaced apart from an upper portion of the piezoelectric ceramic to thereby enclose the piezoelectric ceramic and absorbing vibration; a case spaced apart from sides and a lower surface of the sound absorbing material to thereby enclose the sound absorbing material and having a shape in which a bottom surface including the epoxy molding part stacked thereon protrudes upwardly; and a molding material filled on an upper surface of the sound absorbing material and between the sides and the lower surface of the sound absorbing material and the case.

The sound absorbing material may contain non-woven and cork.

The epoxy molding part may have a lower surface disposed at a position higher than that of the lower surface of the sound absorbing material.

The molding material may be silicon or polyurethane.

The sound absorbing material and the piezoelectric ceramic may include an inter-space formed therebetween.

The molding material may be filled while enclosing an upper portion, side portions, and a lower portion of the sound absorbing material.

The piezoelectric ceramic may have the side contacting an inner wall of the sound absorbing material and vibration of the piezoelectric ceramic may be generated upwardly.

The piezoelectric ceramic may be formed of a piezoelectric element.

The molding material may be molded and filled at a time from an upper portion of the sound absorbing material to a lower portion thereof through side portions thereof.

BRIEF DESCRIPTION OF THE DRAWINGS

FIG. 1 is a cross-sectional view of an ultrasonic sensor according to a preferred embodiment of the present invention.

DESCRIPTION OF THE PREFERRED EMBODIMENTS

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

FIG. 1 is a cross-sectional view of an ultrasonic sensor according to a preferred embodiment of the present invention. An ultrasonic sensor 100 is configured to include a case 110, a sound absorbing material 120, a piezoelectric ceramic 130, an inter-space 140, a molding material 150, a protrusion part 160, and an epoxy molding part 170.

The ultrasonic sensor according to the preferred embodiment of the present invention includes the molding material mounted in an inner portion thereof to serve to remove or absorb an ultrasonic wave transferred to the rear thereof, thereby reducing a ring down time (a time required to identify vibration). Generally, as a method for sensing an object of the rear of a vehicle, there is a method using infrared ray characteristics or ultrasonic wave characteristics.

The case 110 of the ultrasonic sensor 100 according to the preferred embodiment of the present invention serves to protect the ultrasonic sensor 100 from the outside and form an inner space.

The case 110 includes the sound absorbing material 120 embedded in an inner portion thereof, the molding material 150 is filled while enclosing the surrounding of the sound absorbing material 120, and the sound absorbing material 120 includes the piezoelectric ceramic 130 provided in an inner portion thereof.

A material and a shape of the case 110 are not limited. However, it is generally preferable that the case 110 has a rectangular shape in which the sound absorbing material 120 may be easily embedded therein and the molding material 150 may be easily filled and the case 110 is made of a material invulnerable to external impact.

The sound absorbing material 120, which is embedded into the case 110 to thereby serve to absorb vibration and sound, includes the piezoelectric ceramic 130 mounted in the inner portion thereof.

The sound absorbing material 120 is embedded in the case so as to be spaced apart from an inner wall and a bottom of the case, is configured of an upper portion and both side portions, has a shape in which a central lower portion thereof is opened, and prevents vibration from being transferred to the side portion when the piezoelectric ceramic 130 mounted in the inner portion thereof vibrates.

The sound absorbing material 120 contains non-woven and cork as its main material, the sound absorbing material 120 and the piezoelectric ceramic 130 include the inter-space 140 formed therebetween, and the piezoelectric ceramic 130 contacts an inner side wall of the sound absorbing material 120, thereby making it possible to minimize residual vibration of the case 110.

Particularly, the sound absorbing material 120 is embedded in the case so as to be spaced apart from the inner wall of the case, is configured of the upper portion and both side portions, and has a 'ㄷ' shape in which the central lower portion thereof is opened, thereby making it possible to prevent vertical vibration of the piezoelectric ceramic 130 from being hindered.

The piezoelectric ceramic 130, which is formed of a piezoelectric element and is to generate an ultrasonic wave over the entire inner surface of the case 110, vibrates vertically while generating the ultrasonic wave at the time of application of power.

The piezoelectric ceramic 130 is mounted with includes the sound absorbing material 120 and the molding material 150 in order to absorb and decay an unnecessary sound wave generated from a rear surface thereof.

The inter-space 140 prevents the sound absorbing material 120 from hindering vibration of the piezoelectric ceramic 130 by air when the piezoelectric ceramic 130 vibrates vertically by the ultrasonic wave.

That is, the inter-space 140 indicates that the air is filled between the sound absorbing material 120 and the piezoelectric ceramic 130. The piezoelectric ceramic 130 has sides contacting the sound absorbing material 120 and has the inter-space 140 formed on an upper surface thereof, thereby making it possible to smoothly perform upward vibration of the piezoelectric ceramic 130 simultaneously with preventing lateral vibration thereof.

Therefore, the sound wave and the vibration discharged to the rear surface of the piezoelectric ceramic 130 are absorbed and decayed by an air layer of the inter-space 140 and then secondarily absorbed by the sound absorbing material 120 and the molding material 150, thereby making it possible to improve transmission and reception sensitivity.

The molding material 150 is injected into the inner portion of the case 110 and injected into a gap between the sound absorbing material 120 and the case 110.

The molding material 150 is a silicon material or a polyurethane material, is filled on the upper portion of the sound absorbing material 120 and in gaps between the side portions of the sound absorbing material 120 and the case 110, and is also filled in a gap between the protrusion part 160, which is a lower portion of the sound absorbing material 120 having the ' 'ㄷ' ' shape, and a bottom surface of the case 110.

The sound absorbing material 120 includes the epoxy molding part 170 formed at a central portion thereof, wherein the epoxy molding part 170 has a lower surface disposed at a position higher than that of a lower surface of the protrusion part 160 of the sound absorbing material 120.

Therefore, the molding material 150 may not penetrate through the epoxy molding part 170, and the epoxy molding part 170 includes the piezoelectric ceramic 130 stacked on an upper portion thereof, such that the molding material 150 does not penetrate through the piezoelectric ceramic 130.

As described above, the sound absorbing material 120 has the ' 'ㄷ' ' shape to enclose the piezoelectric ceramic 130, such that the molding material 150 does not directly affect the piezoelectric ceramic 130. In addition, the molding material 150 is filled at a time while enclosing the upper portion, the side portions, and the lower portion of the sound absorbing material 120, thereby making it possible to simplify a process.

In addition, large vibration decay is generated in the vicinity of a distal end of the case 110, thereby making it possible to reduce a ring down time by about 10 to 15% as compared to the case according to the prior art. The ring down time indicates a time required to identify vibration.

As set forth above, with the ultrasonic sensor 100 according to the preferred embodiment of the present invention, the sound absorbing material 120 has a size smaller than that of the case 110 to thereby be mounted in the inner portion of the case 110, the sound absorbing material 120 has the '' ⊏ '' shape, and the molding material 150 is injected on the upper portion of the sound absorbing material 120, between the sound absorbing material 120 and the case 110, and on the lower portion of the sound absorbing material 120.

The sound absorbing material 120 has a lower surface disposed at a position lower than that of a lower surface of the piezoelectric ceramic 130 provided at a central portion thereof, thereby making it possible to prevent the molding material 150 injected on the lower surface of the sound absorbing material 120 from affecting the piezoelectric ceramic 130.

In addition, the sound absorbing material 120 has the '' ⊏ '' shape and the sound absorbing material 120 and the piezoelectric ceramic 130 include the inter-space 140 formed therebetween, such that vibration force of the piezoelectric ceramic 130 may be applied upwardly.

Furthermore, the molding material 150 is injected on the upper portion of the sound absorbing material 120 and into the gap between the sound absorbing material 120 and the case 110 to integrate upper and lower moldings with each other, thereby making it possible to simplify a process. Further, large vibration decay is generated in the vicinity of the distal end of the case 110, thereby making it possible to significantly reduce the ring down time.

Although the embodiment of the present invention has been disclosed for illustrative purposes, it will be appreciated that an ultrasonic sensor according to the invention is not limited thereby, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. An ultrasonic sensor comprising:
   an epoxy molding part:
   a piezoelectric ceramic stacked on an upper portion of the epoxy molding part;
   a sound absorbing material contacting sides of the piezoelectric ceramic and spaced apart from an upper portion of the piezoelectric ceramic to thereby enclose the piezoelectric ceramic and absorbing vibration;
   a case spaced apart from sides and a lower surface of the sound absorbing material to thereby enclose the sound absorbing material and having a shape in which a bottom surface including the epoxy molding part stacked thereon protrudes upwardly; and
   a molding material filled on an upper surface of the sound absorbing material and between the sides and the lower surface of the sound absorbing material and the case.

2. The ultrasonic sensor as set forth in claim 1, wherein the sound absorbing material contains non-woven and cork.

3. The ultrasonic sensor as set forth in claim 1, wherein the epoxy molding part has a lower surface disposed at a position higher than that of the lower surface of the sound absorbing material.

4. The ultrasonic sensor as set forth in claim 1, wherein the molding material is silicon or polyurethane.

5. The ultrasonic sensor as set forth in claim 1, wherein the sound absorbing material and the piezoelectric ceramic include an inter-space formed therebetween.

6. The ultrasonic sensor as set forth in claim 1, wherein the molding material is filled while enclosing an upper portion, side portions, and a lower portion of the sound absorbing material.

7. The ultrasonic sensor as set forth in claim 1, wherein the piezoelectric ceramic has the side contacting an inner wall of the sound absorbing material and vibration of the piezoelectric ceramic is generated upwardly.

8. The ultrasonic sensor as set forth in claim 1, wherein the piezoelectric ceramic is formed of a piezoelectric element.

9. The ultrasonic sensor as set forth in claim 1, wherein the molding material is molded and filled at a time from an upper portion of the sound absorbing material to a lower portion thereof through side portions thereof.

\* \* \* \* \*